United States Patent
Cho

[11] Patent Number: 6,143,669
[45] Date of Patent: Nov. 7, 2000

[54] METHOD OF GROWING GATE OXIDES

[75] Inventor: Won Ju Cho, Chungcheongbuk-do, Rep. of Korea

[73] Assignee: Hyundai Electronics Industries Co., Ltd., Kyoungki-Do, Rep. of Korea

[21] Appl. No.: 09/192,498

[22] Filed: Nov. 17, 1998

[30] Foreign Application Priority Data

Dec. 26, 1997 [KR] Rep. of Korea ............ 97-74378

[51] Int. Cl.⁷ .................................................. H01L 21/31
[52] U.S. Cl. ...................... 438/770; 438/275; 438/766; 438/783; 257/616
[58] Field of Search ............................. 438/440, 275, 438/766, 787, 433, 449, 770, 783; 257/616

[56] References Cited

U.S. PATENT DOCUMENTS

| 5,358,894 | 10/1994 | Fazan et al. | 437/70 |
|---|---|---|---|
| 5,497,021 | 3/1996 | Tada . | |
| 5,502,009 | 3/1996 | Lin | 437/239 |
| 5,869,385 | 2/1999 | Tang et al. | 438/440 |
| 6,040,019 | 3/2000 | Ishida et al. | 427/526 |

OTHER PUBLICATIONS

S. Wolf, R. Tauber. Silicon Processing for the VLSI Era, vol. 1: Process Technology. Lattice Press, California, 1986. p. 280.

Doyle, B.; Soleimani, H.R.; Philipossian, A., Simultaneous Growth of Different Thickness Gate Oxides in Silicon CMOS Processing. IEEE Electron Device Letters, vol. 16, No. 7 Jul. 1995, pp. 301–302.

*Primary Examiner*—Donald L. Monin, Jr.
*Assistant Examiner*—Ginette Peralta

[57] ABSTRACT

A method for manufacturing a gate oxide film in a semiconductor device includes: preparing a semiconductor substrate having a first and a second active region; implanting germanium ions into the first active region; and forming a first and a second gate oxide films on the first and the second active regions, respectively, wherein the first gate oxide film is thicker than the second gate oxide film.

14 Claims, 6 Drawing Sheets

0
METHOD OF GROWING GATE OXIDES

BACKGROUND OF THE INVENTION

1. Field of the Invention

The present invention relates to metal-oxide-semiconductor (MOS) devices and, more particularly, to a method of growing MOS gate oxides.

2. Discussion of Related Art

Perhaps the most important application of thermal oxidation to ULSI processing is forming of the thin gate insulating layer of MOS devices. For example, gate oxide layers thinner than 150 Å are required for MOS transistors with gate lengths below 1 µm, while gate oxides thinner than 80 Å are required for the tunnel oxides of electrically alterable read-only memories.

Since the silicon dioxide ($SiO_2$) layers are, in these cases, components of active devices, the thin oxide layers must be uniform, of high quality, and must be formed by means of a sufficiently slow process so that the oxide thickness can be reliably controlled. Control of gate oxide thickness is particularly important, since the threshold voltage of an MOS device depends on the thickness of its gate oxide. The difficulty of reliably controlling gate oxide thickness is moreover compounded when gate oxides of two different thicknesses must be formed during the manufacture of a single device.

A conventional method for forming thin MOS gate oxides having two different thicknesses is described immediately below with reference to the idealized cross-sectional views of FIGS. 1A–1D.

Thick field oxides 11 on a silicon substrate 10 define first and second active (i.e., device) regions of the substrate. The first active regions are defined as those active regions over which the thicker of the two subsequently formed gate oxides is formed, while the second active regions are defined to be those active regions over which the thinner of the two gate oxides is formed.

After first oxides 12a and 12b have been thermally grown at the surface of the substrate over the first and second active regions, respectively, a photoresist coating is spun onto the wafer, photoresist pattern PR1 which masks the first active regions is formed by means of conventional exposure and development process steps, as shown in FIG. 1B.

Masked by the photoresist pattern PR1, the substrate 10 is selectively etched to remove the first oxides 12b over the second active regions, thereby exposing the surface of the substrate 10 over the second active regions, as shown in FIG. 1C. The photoresist pattern PR1 is then stripped so the first oxides 12a over the first active regions is thereby exposed. Second oxides 13a and 13b are then thermally grown at the surface of the substrate over the first and second active regions, respectively, as shown in FIG. 1D. Each of the second oxides 13b over the second active regions will subsequently serve as a thinner gate oxide 14b of an MOS device. At the same time, the second oxides 13a over the first active regions are thermally grown at the surface of the substrate under the first oxides 12a over the first active regions. Each of the first oxides 12a over the first active regions and the second oxide 13a grown under it will together subsequently serve as a thicker gate oxide 14a of an MOS device. (The second oxides 13a over the first active regions grow under the first oxides 12a over the first active regions, rather over the first oxides 12a over the first active regions, because the oxidant, rather than silicon, diffuses through the first oxides 12a during the course of thermal oxidation of the silicon substrate.)

Conventional methods of forming gate oxides of two different thicknesses on a silicon substrate, as typified by the sequence of process steps described above, require two separate thermal oxidations. Moreover, since the first photoresist pattern PR1 is formed on the first oxides 12a over the first active regions and the second oxides 13a over the first active regions are grown under the first oxides 12a, the thicker gate oxides 14a, each of which comprises a second oxide 13a and the first oxide 12a over it, are inevitably contaminated by organic and metallic remnants of photoresist.

SUMMARY OF THE INVENTION

An object of the present invention is to provide a method of thermally growing gate oxides of two different thicknesses at the surface of a silicon substrate in a single process step. After forming of isolation structures defining first and second active regions of the substrate, a mask oxide is deposited onto region the second active regions. Germanium is then selectively implanted into the substrate, which is masked by the deposited mask oxide, in order to form a shallow, heavily doped layer of germanium at the surface of the first active region. The function of the implanted germanium is to accelerate thermal oxidation at the surface of the substrate over the first active region during a subsequent process step. After the mask oxide is stripped, first and second oxides are thermally grown on the first and second active regions, respectively, where the first oxide is necessarily thicker than the second.

BRIEF DESCRIPTION OF THE DRAWINGS

None of the figures briefly described below are drawn to scale. As is common in the art of integrated circuit representation, the thicknesses and lateral dimensions of the various structures shown in the figures were chosen only to enhance the legibility of the figures.

DETAILED DESCRIPTION OF THE PREFERRED EMBODIMENTS

Figure 1A:
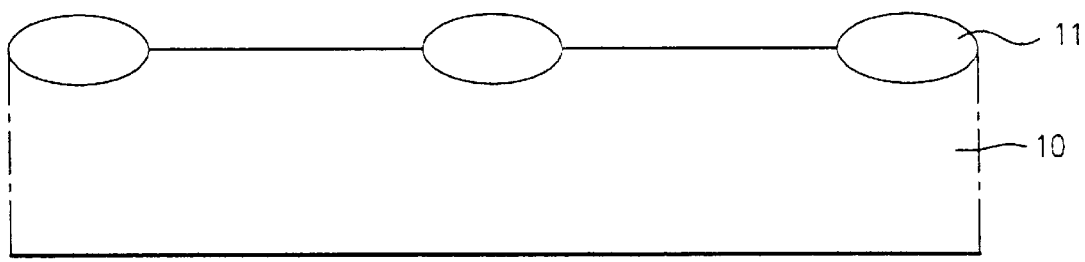
FIGS. 1A–1D are idealized cross-sectional views illustrating process steps of a conventional method of forming gate oxides of two different thicknesses.
Figure 1B:
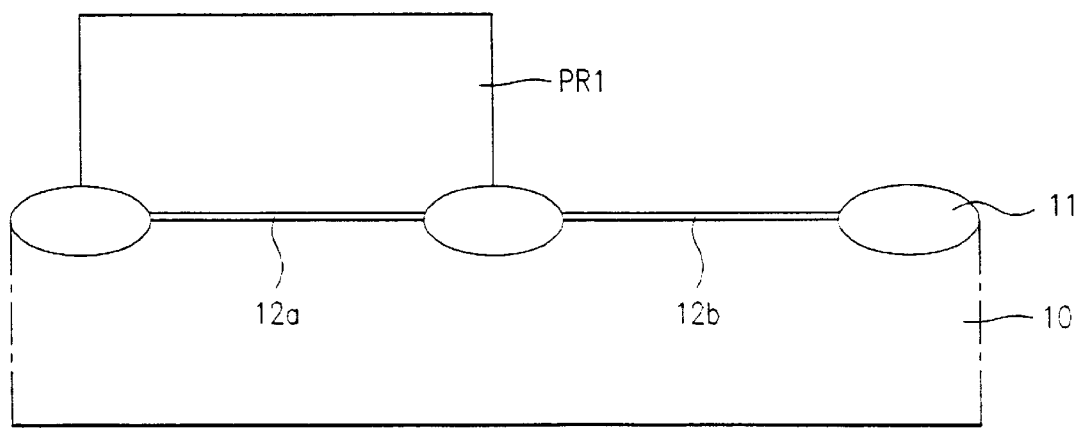
Figure 1C:
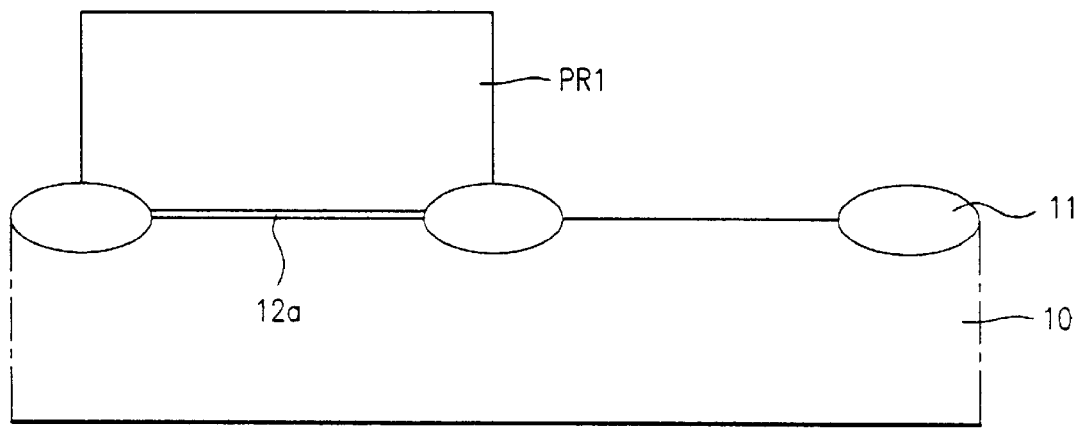
Figure 1D:
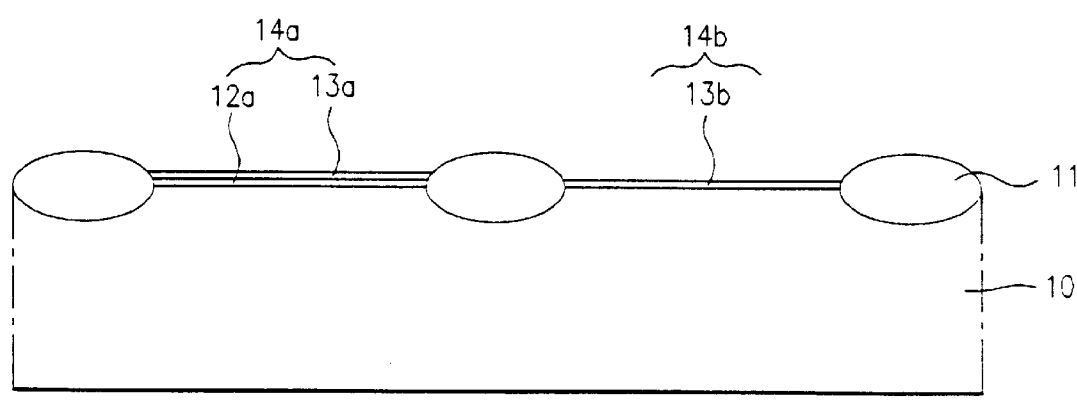
Figure 2A:
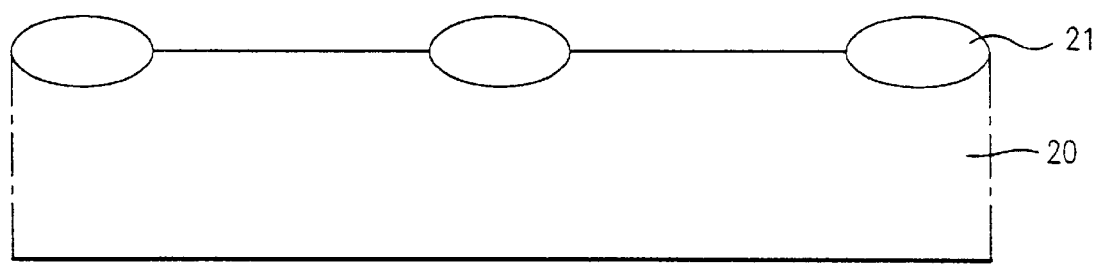
FIGS. 2A–2F are cross-sectional views illustrating process steps of a method of thermally growing gate oxides of two different thicknesses at the same time according to an embodiment of the present invention.

Isolation structures 21 formed on a silicon substrate 20 define first and second active (i.e., device)regions of the substrate 20. The first and second active regions will have the thicker and the thinner, gate oxides, respectively thermally grown thereon in a single process step. Although the isolation structures 21 shown in FIG. 2A represent thick field oxides obtained by means of a conventional LOCOS (local oxidation of silicon) process, isolation technologies other than LOCOS, such as trench isolation, may also be employed to fabricate the isolation structures 21. Just as the isolation structures 21 need not be the LOCOS field oxides represented in FIG. 2A, the isolation structures need not be all the same size.

Figure 2B:
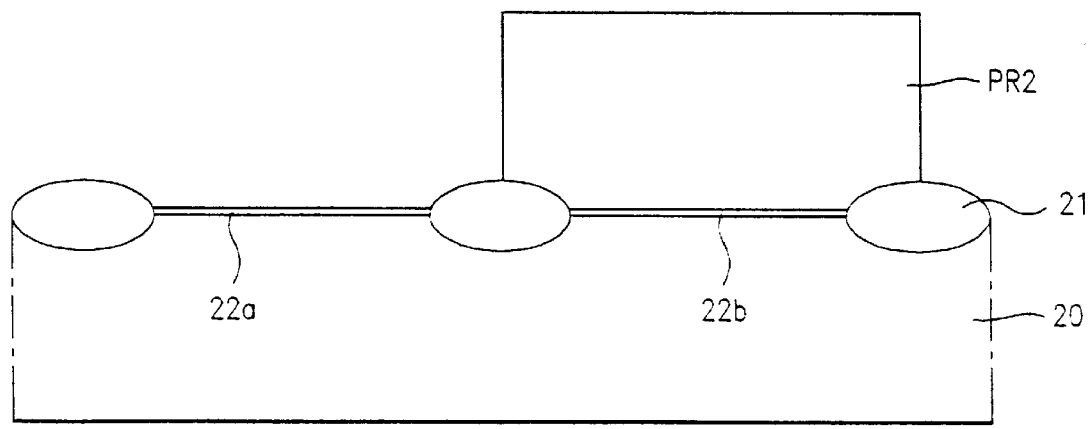

Mask oxides 22a and 22b are formed by a process other than thermal oxidation (preferably by high-temperature, low-pressure chemical vapor deposition) on the first and second active regions, respectively. A coating of photoresist is spun onto the mask oxides, from which a photoresist pattern PR2 which masks the second active regions is formed by conventional exposure and development process steps, as shown in FIG. 2B.

Figure 2C:
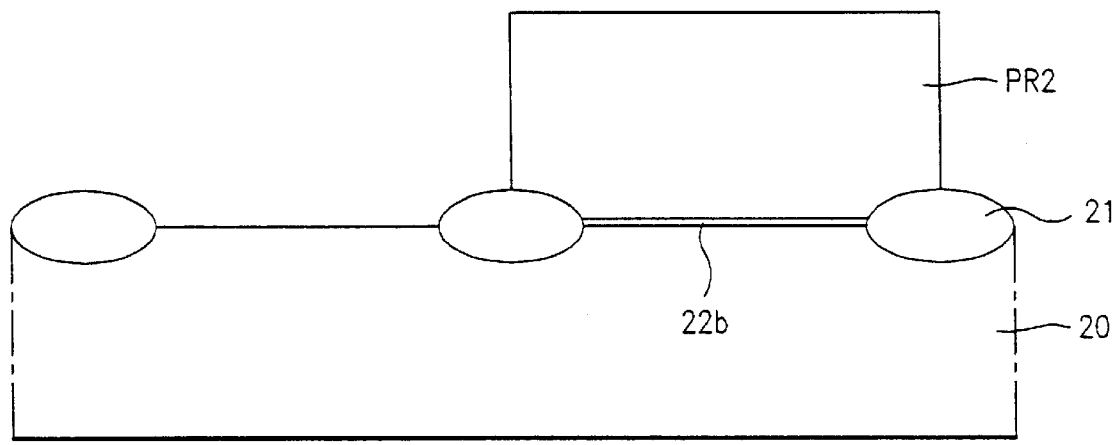

Masked by the photoresist pattern PR2, the substrate 20 is selectively etched to remove the mask oxide 22a over the first active region, as shown in FIG. 2C.

Figure 2D:
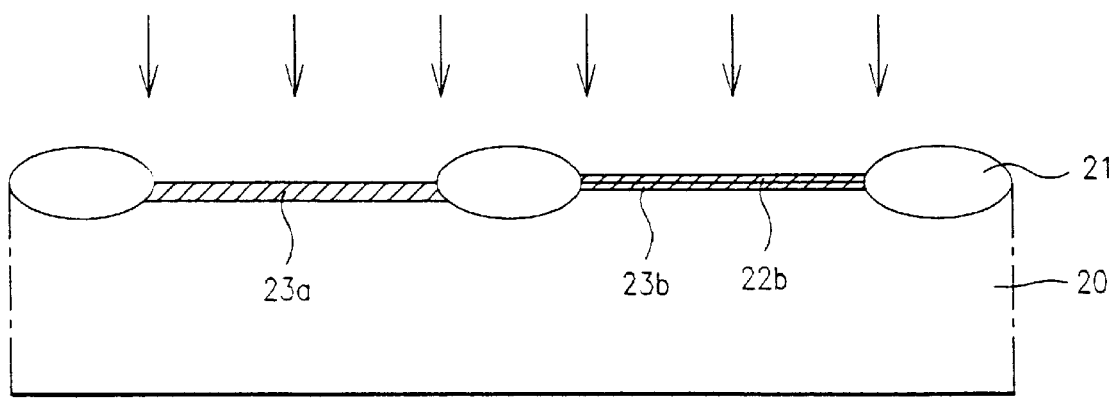
Figure 3A:
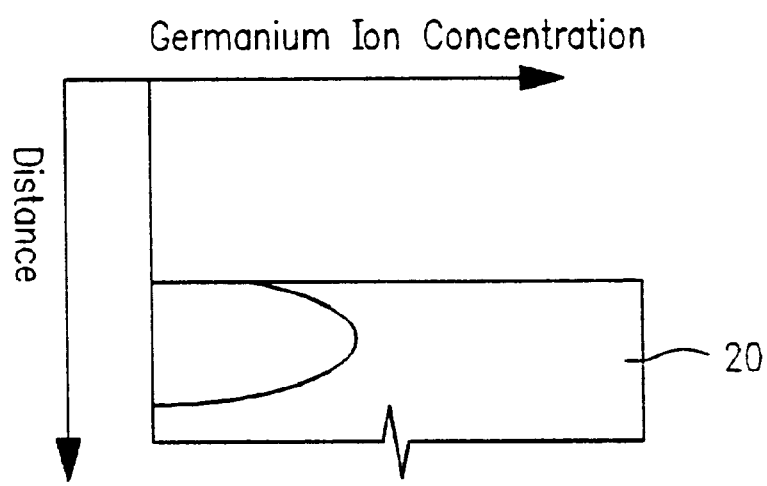
FIGS. 3A and 3B show the dependence of the germanium concentration on depth below the surface of the substrate in the first and second active regions, respectively, according to an embodiment of the present invention.
Figure 3B:
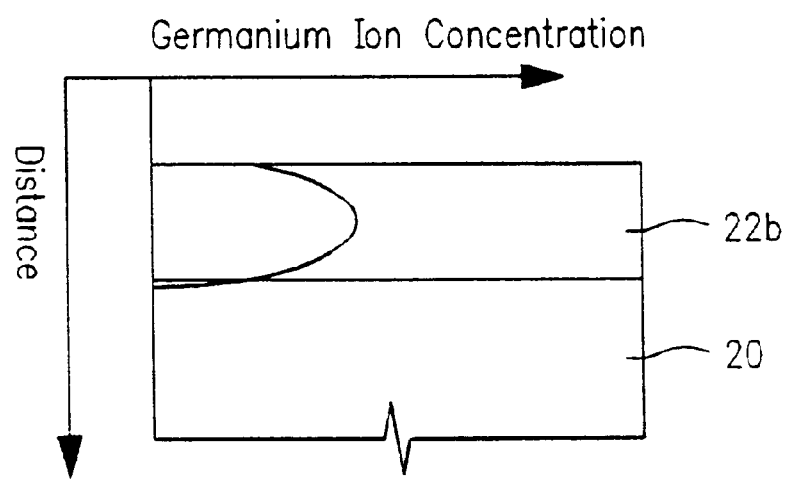

The photoresist pattern PR2 is then striped, and germanium is selectively implanted (implant energy: preferably 20–100 keV.; implant dose: preferably $5 \times 10^{14} - 1 \times 10^{16}$ atoms/cm$^2$) into the substrate, which is masked by the mask oxide 22b, and The substrate is then annealed (anneal temperature: preferably 800–850° C.) in order to form shallow, heavily doped germanium layer 23a within the first active region, as shown in FIGS. 2D and 3A. The implantation and subsequent anneal may also form a shallow, very lightly doped germanium layer 23b within the second active region, as shown in FIGS. 2D and 3B.

The function of the implanted germanium is to accelerate (i.e., increase the rate of) thermal oxidation at the first active region during a later process step. (The commonly-used Group III and Group V dopants also increase the rate of thermal oxidation of silicon when they are present in high concentration within a silicon substrate, but leave p-and n-type substrates, respectively, rather than an intrinsic substrate, in the wake of the post-implant anneal.) The germanium which comprises the shallow, heavily doped layer 24a and the shallow, very lightly doped layer 24b remains at the Si/Sio$_2$ interface during thermal oxidation, since the mean displacement of germanium normal to the interface due to diffusion during oxidation is less than the distance into the substrate traveled by the Si/Si0$_2$ interface during oxidation.

The energy of the incident germanium ions (preferably 20–100 keV) is dictated by the thickness of the mask oxide 22b over the second active region in the sense that the full dose of germanium implanted over the second active region is, under ideal circumstances, be confined within the mask oxide 22b. Under the less than ideal circumstances that are often operative in practice, a fraction of the incident germanium dose implanted over the second active region may well penetrate the mask oxide 22b over the second active regions to form shallow, very lightly doped germanium layer 23b within the second active regions, as shown in FIGS. 2D and 3B. In contrast, the full dose of germanium implanted over the first active region forms a shallow, heavily doped germanium layer 23b within the first active region, as shown in FIGS. 2D and 3A.

Figure 2E:
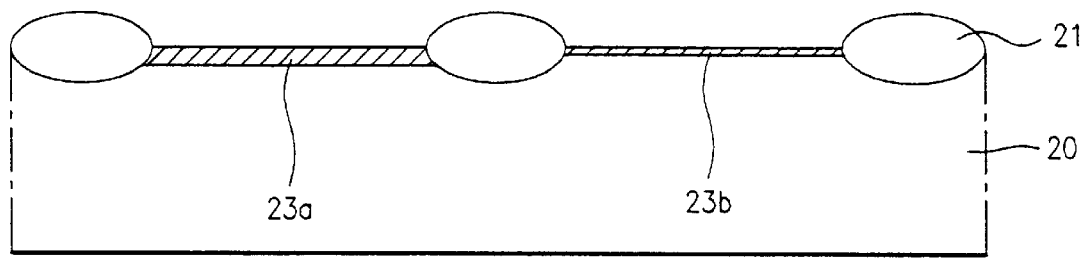

As shown in FIG. 2E, the mask oxide 22b over the second active region is removed, (preferably by means of selective wet-chemical etching the does not attack the silicon substrate) in order to expose the surface of the substrate over the second active regions.

Figure 2F:
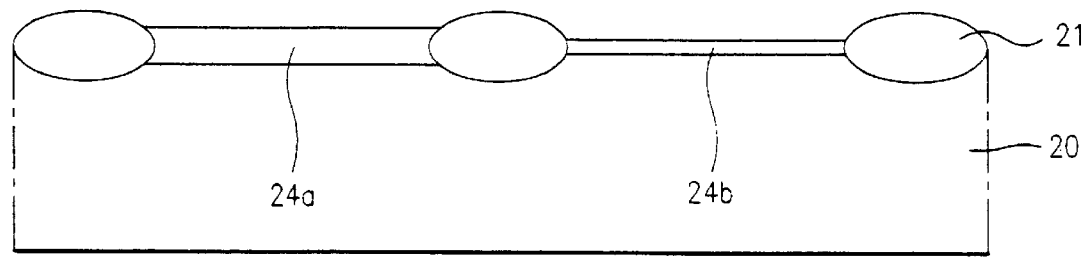

As shown in FIG. 2F gate oxides 24a and 24b are thermally grown at the same time at the first and second active regions, respectively. The heavily doped germanium layer 23a within the first active region accelerate thermal oxidation at the first active region, resulting in 50–90 Å gate oxide 24a there, while the very lightly doped germanium layer 23b within the second active region do not substantially accelerate thermal oxidation at the second active region, resulting in 30–70 Å gate oxides 24b there.

Thermally growing gate oxides of two different thicknesses at the same time according to the method of the present invention enjoys several advantages over conventional methods of forming gate oxides of two different thicknesses, not the least of which is simplicity-only one thermal oxidation process is required rather than two. According to the method of the present invention, the thicker of the gate oxides is not contaminated with photoresist remnants, in contrast to conventional methods. Moreover, germanium within the substrate immediately below the gates oxides serves to increase the mobility of charge carriers within the channels of the MOS devices fabricated in subsequent process steps.

The embodiments described above are intended to illustrate the invention, but not to exhaustively delineate every detail of the invention as practiced. It will be apparent to those skilled the art of MOS device fabrication that various modifications may be made to the method of the present invention without departing from the spirit of the invention. The present invention is thus intended to cover such modifications provided they fall within the scope of the claims and their equivalents.

What is claimed is:

1. A method for manufacturing a gate oxide film comprising:
   preparing a semiconductor substrate having a first and a second active region;
   implanting germanium ions into the first active region; and
   forming a first and a second gate oxide film simultaneously on the first and the second active regions, respectively, wherein the first gate oxide film is thicker than the second gate oxide film.

2. The method according to claim 1, wherein the germanium ion implantation is conducted with an implant energy of 20–100 KeV and an implant dose of $5 \times 10^{14} - 1 \times 10^{16}$ atoms/cm$^2$.

3. The method according to claim 1, wherein the first and second gate oxide layers are formed by thermal oxidation.

4. The method according to claim 3, wherein the thermal oxidation is conducted at a temperature of 800–850° C.

5. A method for manufacturing a gate oxide film comprising:
   preparing a semiconductor substrate having a first and a second active region;
   forming a masking layer on the second active region;
   implanting germanium ions into the semiconductor substrate, wherein the germanium ions are piled up into the surface of the semiconductor substrate in the first active region and into the masking layer in the second active region; and
   forming a first and a second gate oxide film simultaneously on the first and the second active regions, respectively, wherein the first gate oxide film is thicker than the second gate oxide film.

6. The method according to claim 5, wherein the masking layer consists of silicon dioxide.

7. The method according to claim 5, wherein the germanium ion implantation is conducted with an implant energy of 20–100KeV and an implant dose of $5 \times 10^{14} - 1 \times 10^{16}$ atoms/cm$^2$.

8. The method according to claim 5, wherein the first and second gate oxide layers are formed by thermal oxidation.

9. The method according to claim 8, wherein the thermal oxidation is conducted at a temperature of 800–850° C.

10. A method for manufacturing a gate oxide film, comprising:
    preparing a semiconductor substrate having a first and a second active region and an isolation region therebetween;

forming an isolation film on the isolation region;

forming a masking layer on the second active region;

implanting germanium ions into the semiconductor substrate, wherein the germanium ions are piled up into the surface of the semiconductor substrate in the first active region and the masking layer in the second active region; and forming a first and a second gate oxide film simultaneously on the first and the second active regions respectively, wherein the first gate oxide film is thicker than the second gate oxide film.

11. The method according to claim 10, wherein the masking layer consists of a silicon dioxide.

12. The method according to claim 10, wherein the germanium ions implantation is conducted with an implant energy of 20–100 KeV and an implant dose of $5 \times 10^{14}$–$1 \times 10^{16}$ atoms/cm$^2$.

13. The method according to claim 10, wherein the first and second gate oxide layers are formed by thermal oxidation.

14. The method according to claim 12, wherein the thermal oxidation in conducted at a temperature of 800–850° C.

* * * * *